(12) United States Patent
Donth et al.

(10) Patent No.: US 10,010,011 B2
(45) Date of Patent: Jun. 26, 2018

(54) INVERTER HAVING TWO-PART HOUSING

(71) Applicant: SMA Solar Technology AG, Niestetal (DE)

(72) Inventors: Andreas Donth, Edermuende (DE); Jens Dittmar, Nieste (DE); Swetlana Lisitschew, Munich (DE)

(73) Assignee: SMA Solar Technology AG, Niestetal (DE)

( * ) Notice: Subject to any disclaimer, the term of this patent is extended or adjusted under 35 U.S.C. 154(b) by 0 days. days.

(21) Appl. No.: 14/805,632

(22) Filed: Jul. 22, 2015

(65) Prior Publication Data

US 2015/0342087 A1 Nov. 26, 2015

Related U.S. Application Data

(63) Continuation of application No. PCT/EP2014/051091, filed on Jan. 21, 2014.

(30) Foreign Application Priority Data

Jan. 22, 2013 (DE) ........................ 10 2013 100 607

(51) Int. Cl.
 *H05K 7/20* (2006.01)

(52) U.S. Cl.
 CPC ..... *H05K 7/20145* (2013.01); *H05K 7/20218* (2013.01); *H05K 7/20918* (2013.01)

(58) Field of Classification Search
 CPC ...... H05K 7/209; H05K 7/2089; H05K 7/023; H05K 7/1432; H05K 5/0021; H05K 5/0065; H02M 7/003

USPC ................................................. 361/699, 735

See application file for complete search history.

(56) References Cited

U.S. PATENT DOCUMENTS

| | | | | |
|---|---|---|---|---|
| 2,942,856 | A | * | 6/1960 | Woodward ......... H05K 7/20009 165/144 |
| 5,422,786 | A | | 6/1995 | Wolfgang |
| 6,091,604 | A | * | 7/2000 | Plougsgaard ......... H02M 7/003 165/185 |
| 2001/0015583 | A1 | | 8/2001 | Petit et al. |
| 2006/0012000 | A1 | | 6/2006 | Weber et al. |
| 2008/0291609 | A1 | | 11/2008 | Victor et al. |
| 2011/0199736 | A1 | | 8/2011 | Sawada et al. |
| 2011/0294336 | A1 | | 12/2011 | Stockinger et al. |

(Continued)

FOREIGN PATENT DOCUMENTS

| | | |
|---|---|---|
| WO | 2008028205 A1 | 3/2008 |
| WO | 2011151253 A1 | 8/2011 |

*Primary Examiner* — Mukund G Patel
(74) *Attorney, Agent, or Firm* — Eschweiler & Potashnik, LLC

(57) ABSTRACT

The disclosure relates to an inverter having a first housing module, a second housing module, removably connected to the first housing module, and power-electronic components in both housing modules, wherein a cooling air channel, opening in the surroundings of the inverter, is delimited in the circumferential direction partially by the first housing module and partially by the second housing module. The first housing module is configured to mount to an external structure and the second housing module is configured to mount to the first housing module. The cooling air channel extends at a distance to a mounting plane of the inverter defined by the first housing module opposite the external structure.

19 Claims, 13 Drawing Sheets

(56) References Cited

U.S. PATENT DOCUMENTS

2012/0261100 A1 10/2012 Aoki
2012/0262968 A1 10/2012 Nagano et al.
2013/0038993 A1 2/2013 Dorfer et al.

\* cited by examiner

INVERTER HAVING TWO-PART HOUSING

CROSS REFERENCE TO RELATED APPLICATIONS

This application claims priority to International Patent Application number PCT/EP2014/051091, filed on Jan. 21, 2014, which claims priority to German Patent Application number 10 2013 100 607.8, filed on Jan. 22, 2013, and is hereby incorporated by reference in its entirety.

FIELD

The disclosure relates to an inverter comprising a housing, which has a first housing module, a second housing module, which is connected detachably to the first housing module, and a cooling air channel, which opens out into the surrounding environment of the inverter, and comprising power electronics component parts in the two housing modules.

In particular, the disclosure relates to an inverter with which electrical energy is fed from a photovoltaic generator in decentralized fashion into an AC grid.

BACKGROUND

EP 2 006 988 A1 discloses an inverter comprising a housing, which comprises at least two housing chambers. The two housing chambers are formed in a common basic body of the housing and can each be closed by a separate cover. Power electronics component parts of the inverter are in this case accommodated in a first of the two housing chambers, while connection plugs and a communications unit are accommodated in the second housing chamber. In this way, it is not necessary for the cover of the first housing chamber to be opened for connection work to be performed, it being possible for the housing chamber to have a higher class of protection than the second housing chamber. Thus, the first housing chamber, in accordance with this class of protection, is particularly protected from environmental influences, in particular from moisture. At least one electrical connection leads into the first housing chamber from the second housing chamber, the electrical connection having the class of protection of the first housing chamber. The electrical connection comprises a female connector, which is arranged in the wall with respect to the first housing chamber and serves the purpose of receiving a male connector.

US 2001/0015583 A1 discloses a converter for an electric motor or transformer. The converter has a junction box comprising passages for electrical conductors and a semiconductor electronics module, which is fastened on the junction box. The semiconductor electronics module has a box forming a radiator, wherein at least one electronic card is cast with thermally conductive resin in the box forming the radiator. At least one connection protrudes from the resin, the connection being accessible via a window in the junction box.

US 2006/0120001 A1 discloses a modular inverter, in which substantially the same inverter functions and application-specific components are distributed on different modules. The modules can be arranged in one or more housing modules. A cooling air channel, which is connected to a fan and is adjoined by the modules of the inverter arranged in the housing module successively, passes through each housing module. Cooling bodies protrude into the cooling air channel from individual modules.

WO 2011/153564 discloses an inverter comprising an upper and a lower housing part, in which electronic components are arranged and which are electrically connected to one another detachably via a multi-part contact-making system. The lower housing part is provided for fitting, in a fixed position, and for connecting the inverter. Owing to the capacity for the two housing parts to be disconnected from one another, the fitter only needs to support the lower weight of the lower housing part during fitting. The upper housing part, on the other hand, has the essential electronic components and therefore also the mass of the inverter and is only connected later to the lower housing part. Replacement of the upper housing part and the electronic components arranged therein is thus also easily possible. However, the mechanical and electrical connection of the two housing parts by means of a rotary element is complex and results in considerable loading of the connecting parts and seals between the two housing parts during connection and disconnection. A cooling air channel in this known inverter is generally arranged on the rear side of the lower housing part and is thus delimited in the fitted state of the inverter by the supporting area thereof and the lower housing part. Cooling bodies protrude from the lower housing part into this cooling channel.

DE 10 2010 017 168 A1 discloses a cooling arrangement for cooling heat-generating component parts, in particular power electronics component parts. In this case, a pressure chamber is defined beneath a removable front wall, with at least two inlet channels leading to the pressure chamber. A fan is provided in each of these inlet channels in order to suck in air and to drive air through the inlet channel into the pressure chamber. A cooling body is arranged in each of the inlet channels, the cooling body forming a cooling body channel for air flowing through and connecting the inlet channel to the pressure chamber. Furthermore, at least one outlet channel is provided, which leads away from the pressure chamber in order to allow the air driven by the fans through the inlet channels and the cooling body channels to emerge. In the event of failure of a fan, a reversal of the air flow direction through the inlet channel assigned to the failed fan is effected in order to allow air to continue to flow through the connected cooling body channel. The power electronics component parts, which may be those of an inverter, can be fitted on the cooling bodies of the cooling arrangement. The air inlets are provided with gratings or sieves in the case of applications outside, in order to protect from coarse impurities.

DE 10 2011 000 706 A1 discloses an inverter apparatus comprising a power unit. The power unit has semiconductor modules and cooling bodies, wherein the cooling bodies are arranged on both sides of each semiconductor module and in a ventilation path for cooling air. The inverter apparatus is built into a vehicle comprising an AC motor.

DE 43 16 999 A1 discloses an apparatus for dissipating heat out of an interior of a switchgear cabinet of a textile machine which is heated by the operation of electrical and electronic devices. In this case, cooling bodies of the electrical and electronic devices are arranged in a cooling air channel, and cooling air conveyed in the cooling air channel flows along the surface of the cooling bodies. Inverter modules are thus inserted into drawers of a switchgear cabinet in such a way that the cooling bodies, in their end position, form a segment of the cooling air channel running between them in each drawer.

DESCRIPTION OF THE DISCLOSURE

The disclosure is based on the problem of specifying an inverter which is easy to fit even outside and which nevertheless is easy to repair in the event of a defect.

The disclosure relates to an inverter comprising a first housing module, a second housing module, which is connected detachably to the first housing module, and first and second power electronics component parts in the first and second housing modules, respectively. A cooling air channel which opens out into the surrounding environment of the inverter is delimited in the circumferential direction partially by the first housing module and partially by the second housing module. In accordance with the disclosure, the first housing module is configured to fit on an external structure, and the second housing module is configured to fit (in one embodiment, exclusively) on the first housing module. The cooling air channel in this case extends at a spacing from a fitting plane of the inverter, which fitting plane is defined by the first housing module with respect to the external structure.

The cooling air channel can be open, i.e. on one side of its circumference without limitation by the housing. Particularly effective guidance of air and, in the case of a passive throughflow, a particularly effective chimney effect are formed in the cooling air channel, however, when the cooling air channel is closed in the circumferential direction. A closed cooling air channel is in one embodiment understood to mean a cooling air channel which is enclosed completely, at least over a region of its extent in the throughflow direction, i.e. over its entire circumference around this throughflow direction, by the housing of the inverter. In one embodiment, interiors or regions in the interior of the housing modules do not need to adjoin the rear sides of the walls of the housing modules, which delimit the cooling air channel, over the entire circumference of the cooling air channel. The cooling air channel can also be delimited over part of its circumference only via wall segments or cooling ribs protruding from the first or second housing module.

By virtue of the cooling air channel in the inverter according to the disclosure being delimited partially by the first housing module and partially by the second housing module, both the power electronics component parts arranged in the first housing module and the power electronics component parts arranged in the second housing module can be cooled by a cooling air flow through the cooling air channel. The power electronics component parts are in this case not arranged in the cooling air channel but downstream of the walls delimiting the cooling air channel of the two housing modules and therefore protected in the housing modules, however.

The fact that the cooling air channel is delimited in the circumferential direction partially by the first housing module and partially by the second housing module does not mean that the cooling air channel runs in sections following one another along its throughflow direction through the first and second housing modules, but that the cooling air channel is partially or wholly surrounded by the two housing modules assembled. The walls or regions of the first housing module which delimit the cooling air channel partially therefore face the second housing module, and vice versa, and there is in addition at least one region, in the case of a completely enclosed cooling air channel two regions, in which the first and second housing modules abut one another at the circumference of the cooling air channel.

By virtue of the cooling air channel in the inverter according to the disclosure running between the first and second housing modules, the cooling air channel extends at a spacing from the fitting plane of the inverter, which fitting plane is defined by the first housing module with respect to the external structure on which the first housing module is to be fitted. The cooling channel of many conventional inverters is arranged in the region of this fitting plane, however. Such cooling channels of conventional inverters are often at least partially blocked by objects fitted or running in the same fitting plane, however. The profile of the cooling channel of the inverter according to the disclosure therefore improves the preconditions for the unimpeded throughflow of cooling air through the cooling air channel. In this way, sufficient cooling of the power electronics component parts of the inverter can often be achieved purely on the basis of a free, purely convection-related flow and without the use of fans for generating a forced cooling air flow. However, at least the cooling effect of a cooling air channel spaced apart from the fitting plane is markedly optimized owing to the generally lower flow resistance there in comparison with the cooling effect of a cooling air channel which is arranged in the region of the fitting plane.

The first housing module and/or the second housing module can, in the case of the inverter according to the disclosure, each comprise at least one cooling body, which projects into the cooling channel. In this case, a cooling body is typically understood to mean an arrangement of cooling ribs, which protrude from the wall of the first or second housing module which delimits the cooling channel and extend along the throughflow direction of the cooling channel. In principle, the cooling bodies can extend from both housing modules in the same section along the throughflow direction of the cooling air channel into the cooling air channel. In this case, the cooling ribs of the cooling bodies of both housing modules can be opposite one another or arranged so as to be offset with respect to one another and even mesh with one another in the form of a comb in the cooling channel. In particular in the latter case, however, care should be taken to ensure that sufficient free regions remain between the cooling ribs, which ensure a throughflow of cooling air. This can require a reduction in the number of cooling ribs on both housing modules. In order to obtain a flow resistance which is as low and uniform as possible of the airflow through the cooling air channel, however, it is desirable in one embodiment if the cooling bodies project from the two housing modules in different regions, in particular in different sections along the throughflow direction into the cooling channel.

The cooling ribs of the two housing modules can, in the assembled state of the inverter, be spaced apart from one another or be in direct contact with one another. It is also possible for only individual cooling ribs to be in direct contact with one another within the cooling channel. Direct mechanical contact between at least individual cooling ribs of the two housing modules results in heat conduction between the cooling ribs of the two housing modules as well in addition to heat dissipation with the aid of the cooling air flowing through. This effect enables additional heat compensation between the two housing modules and therefore counteracts excessive heating of only one housing module. The cooling air channel between the first and second housing modules can also be wholly or partially closed by cooling ribs in contact with one another. In order to make maximum use of the cooling bodies, power electronics component parts to be cooled in the two housing modules need to be arranged in as close thermal contact with the cooling bodies as possible.

In one embodiment both the first housing module and the second housing module each have at least one receptacle for direct positioning, fixed in position, of one or more of the power electronics component parts in order to couple the component parts thermally to the cooling air channel to the maximum possible extent. That is to say that in one embodiment these receptacles are provided on that side of walls of the housing modules which delimit the cooling air channel which are remote from the cooling air.

If the first housing module and/or the second housing module, which is connected detachably to the first housing module, optionally together with further housing modules, seals off or seal off at least one region for one or more of the power electronics component parts with respect to the surrounding environment, this region can be designed in accordance with a high class of protection, and the inverter can also be suitable for use in an unprotected external region, for example. Each of the two housing modules can comprise one or more regions sealed off purely by this housing module. All of the housing modules can also together, i.e. only in their assembled state, seal off one or more regions, however.

Detachably electrical connections, such as in particular electrical plug-type connections for alternatively making contact with the power electronics component parts in the two housing modules can be provided between the first housing module and the second housing module. These plug-type connections can be closed automatically when the two housing modules are assembled. The electrical connections can also be designed for separate closing in the assembled state of the housing modules, however.

In order to seal off a coherent region between the first housing module and the second housing module with respect to the surrounding environment, at least one seal can be arranged between the first housing module and the second housing module. The necessary sealing force can be applied to this seal during assembly of the two housing modules. In this case, the coherent region can also be a coolant channel for a liquid coolant which extends through the first housing module and the second housing module. By means of the coolant, the heat arising in the interior of the housing modules can be output in a targeted manner to cooling bodies adjoining the cooling air channel or else to an additional external heat sink. Heat to be dissipated can also be transported by circulation of cooling air with a fan within each housing module or a region extending coherently via a plurality of housing modules.

In one embodiment of the inverter according to the disclosure, mechanical linear guides for alternate orientation when the housing modules are assembled linearly, i.e. in a straight line, can be provided between the housing modules. These may be, for example, guide rods anchored on the first housing module, with guide bushes of the second housing module being pushed onto the guide rods. The alternate orientation of the housing modules by the linear guides ensures that the housing modules are assembled in a desired relative arrangement and seals located therebetween, but also plug-type connections, are only acted upon or compressed in predetermined directions. In particular, by virtue of the linear guides during assembly of the inverter, an abrasively acting relative movement between the seal or the seals and the sealing areas opposite the seals is largely eliminated. In this way, the seals are not damaged during assembly of the inverter.

In one embodiment of the inverter according to the disclosure, only the first housing module is provided for fitting on an external structure, such as a wall or a supporting frame, for example, and the second housing module is provided for exclusive fitting on the first housing module. That is to say that the wall anchoring of the inverter according to the disclosure is performed by fitting the first housing module. Correspondingly, in one embodiment only the first housing module needs to be supported by the fitter against the force of its weight. Only then is the second housing module fitted on the first housing module and in the process possibly already supported by linear guides provided between the housing modules. In any case, the fitter never needs to hold the mass of the entire inverter during fitting.

Firstly, DC connections and/or DC switch disconnectors, which are assigned to the input of the inverter, and likewise AC connections and/or AC switch disconnectors, which are assigned to the output of the inverter, can be arranged in the first housing module of the inverter according to the disclosure. Thus, the entire connection of the inverter to the respective input and output can take place on the first housing module which is fitted first. Furthermore, all of the power electronics component parts which have a particularly high mass are arranged in the first housing module, in particular winding materials. These power electronics component parts are generally characterized not only by a high mass, but also by a particularly low susceptibility to faults. Frequently, they are therefore unaffected by repair work on a faulty inverter by replacement of component parts. Thus, the entire first module is then unaffected by such a replacement, which can be restricted to the second housing module. Correspondingly, in one embodiment circuit boards of power electronics and/or switches of an inverter bridge and/or circuit boards of control electronics are arranged in the second housing module. Owing to the complexity of these component parts, repair work on or a replacement of individual components affected by a fault is performed in situ rarely. Repair work on or a replacement of individual components affected by a fault in situ is sometimes even undesirable since, owing to the boundary conditions which are often insufficiently controllable in situ there is the risk of inflicting further damage. It is therefore desirable for a replacement of sensitive component parts to take place under controllable conditions directly on the manufacturer's premises. There, the device together with its replaced component parts can be tested intensively additionally prior to renewed commissioning. In the event of a defect in individual complex component parts, it is therefore generally advisable to replace the affected housing module entirely with a functional housing module and to perform the repair work on the defective components afterwards directly on the premises of the manufacturer. These power electronics component parts are additionally often subject to a much lower mass than winding materials, for example, with the result that the second housing module of the inverter according to the disclosure tends to be lighter than the first housing module.

In the case of the inverter according to the disclosure, therefore, the high masses in the first housing module are supported directly on the supporting structure and then no longer moved, while the smaller and therefore more easily handable masses in the second and any further housing modules are necessarily fitted onto the first housing module and dissembled therefrom.

In one embodiment the first housing module and/or the second housing module each have a basic body consisting of metal, which basic body comprises that part of the housing module(s) which delimits the cooling air channel. Owing to the metal, particularly quick transfer of heat to the cooling air channel and to the cooling air flowing therein is achieved. In one embodiment, the two housing modules each substantially comprise this basic body comprising metal. In one embodiment, these basic bodies are produced by a die-casting method. In this embodiment, the cooling ribs are an inherent component part of the basic body since they are shaped as well by the die-casting method. Alternatively, however, it is also possible to produce the basic bodies on the basis of a welded sheet-metal structure. In this embodiment, the cooling bodies with the cooling ribs are separate extruded profiles, which are adhesively bonded, pressed or welded to the basic body afterwards, for example. In this embodiment, it is within the scope of the disclosure to optimize the heat transfer between adjacent separate components by known measures, for example thermally conductive paste.

At least one further housing module can adjoin the second housing module on its side opposite the first housing module. It is also possible for a plurality of such further housing modules to be provided. In one embodiment, it is preferred if at least two such further housing modules with identical basic bodies are stacked onto the second housing module. These stacks can then be closed off by a housing cover. If the further housing modules are not required, this housing cover can also be used for direct closure of the second housing module. For this purpose, it is desirable in one embodiment for the openings, which are remote from the first housing module, in the second housing module and all further housing modules to have identical dimensions. The basic bodies of the further housing modules and the housing covers can likewise be formed from metal, but also from plastic in order to save on weight.

The cooling air channel of the inverter according to the disclosure can be open at both of its ends, i.e. both at its entry into the housing and at the point at which it opens out into the surrounding environment of the inverter; alternatively, it can be connected at one or both of these ends to at least one cooling air fan. That is to say that the cooling via the cooling air channel can be purely passive owing to the chimney effect forming therein or with the aid of a forced flow brought about by the cooling air fan. In one embodiment if the cooling air channel is operated passively, it is oriented vertically.

If the cooling air channel between the two housing modules branches upwards in the form of a Y or a T while its two upper ends lie laterally on the housing, there is no deposit into the cooling air channel from above. This is advantageous during fitting of the inverter outside.

In the case of a Y-shaped or T-shaped cooling air channel, electrical connections between the first housing module and the second housing module can be arranged in a covered connecting region above the cooling air channel. Depending on the design of the electrical connections, the connecting region does not need to have a particular class of protection.

The cooling air channel of an inverter according to the disclosure can extend in terms of its width over more than two thirds of the width of the housing and thus can cool both the first and the second housing modules over large-area walls delimiting the module.

In principle, in the case of a housing module, in particular the housing module with the greatest heat losses to be dissipated, or else in the case of all housing modules, water cooling or other cooling with a liquid coolant can be provided in addition to the cooling air channel. This additional cooling can be added in addition to the already existing air cooling if required, for example via suitable temperature control. In one embodiment, the additional cooling can act both globally on the housing module and only on locally limited regions or individual components thereof. It is advantageous to provide the additional cooling on the first housing module fitted on an external structure since, in this way, replacement of the second housing module is not impeded by connections for the additional cooling.

Advantageous developments of the disclosure are set forth in the patent claims, the description and the drawings. The advantages of features and of combinations of a plurality of features mentioned in the description are purely by way of example and can take effect alternatively or cumulatively without the advantages necessarily needing to be achieved by embodiments according to the disclosure. Without the subject matter of the attached patent claims being altered hereby, the following applies as regards the disclosure content of the original application documents and the patent: further features can be gleaned from the drawings, in particular the illustrative geometries and the relative dimensions of a plurality of component parts with respect to one another and the relative arrangement and operative connection thereof. The combination of features of different embodiments of the disclosure or of features of different patent claims is likewise possible as a deviation from the selected back-references in the patent claims and is hereby suggested. This also relates to those features which are illustrated in separate drawings or are mentioned in the description thereof. These features can also be combined with features of different patent claims. Likewise, features mentioned in the patent claims can be dispensed with for further embodiments of the disclosure.

The features mentioned in the patent claims and the description should be understood with respect to their number such that precisely this number or a greater number than the mentioned number is provided without the explicit use of the adverb "at least" being necessary. If, therefore, an element is being discussed, for example, this should be understood as meaning that precisely one element, two elements or more elements are provided. These features can be supplemented by other features or be the only features from which the respective product consists.

The reference symbols contained in the drawings in no way restrict the scope of the subjects protected by the patent claims. They merely serve the purpose of making the patent claims more easily understandable.

BRIEF DESCRIPTION OF THE DRAWINGS

The disclosure will be explained and described further below with reference to preferred exemplary embodiments illustrated in the figures.

DETAILED DESCRIPTION

Figure 1:
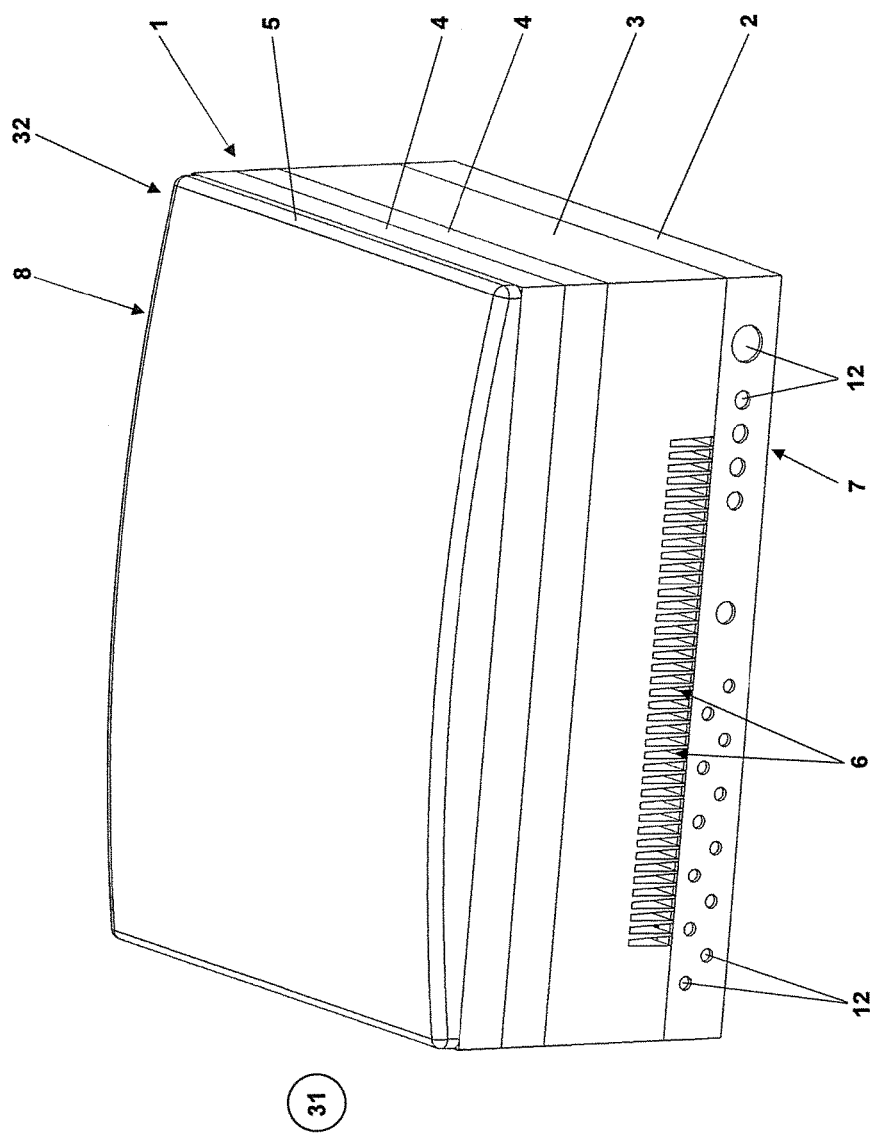
FIG. 1 shows a perspective external view of an inverter according to the disclosure with a viewing direction at an angle from the front.
Figure 2:
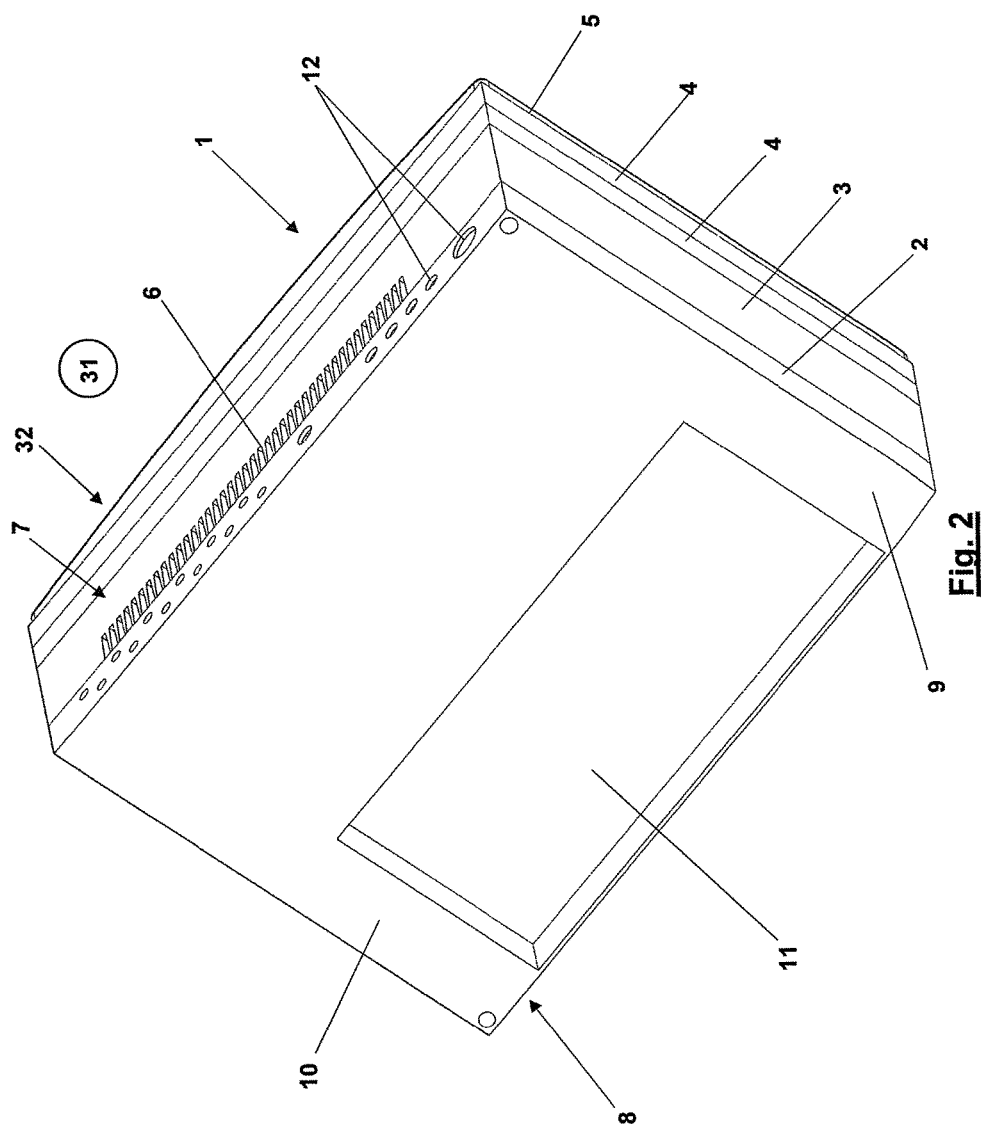
FIG. 2 shows a perspective view of the inverter shown in FIG. 1 with a viewing direction at an angle from the rear.

The inverter 1 illustrated in FIGS. 1 and 2 from two directions has a housing 32 comprising a first, rear housing module 2, a second housing module 3 adjoining the first housing module, two further externally identical housing modules 4 and a housing cover 5 for closing off the stack of housing modules 2 to 4. In one embodiment, a cooling air channel 6 extends between the first housing module 2 and the second housing module 3. The cooling air channel 6 in this case passes substantially linearly from one side 7 of the inverter up to the opposite side 8 of the inverter. In this case, the side 7 of the inverter can be its side which is at the top during operation and the side 8 of the inverter can be its side which is at the bottom during operation, or vice versa. The cooling air channel 6 is thus vertically oriented during operation of the inverter 1, and air heated in the cooling air channel rises upwards as a result of the chimney effect, emerges there into the surrounding environment 31 of the inverter 1 and in the process draws downwards cooler air from the surrounding environment 31. The first housing module 2 at the rear forms, with its rear wall 9, the fitting plane for the fitting of the inverter 1 to an external structure. The cooling air channel 6 is offset forwards with respect to this fitting plane. The throughflow of the cooling air channel 6 with cooling air is thus unimpeded by the external structure and other objects fitted thereon. In one embodiment, on the rear side 9, the housing module 2 has a pocket 11 in its basic body 10 formed in one piece from metal. Coil formers of the inverter 1, for example, can be arranged in this pocket 11. In one embodiment, the pocket 11 can be closed in sealtight fashion by a closure plate (not illustrated here) in order that the housing 32 for these coil formers adheres to a predetermined class of protection. The coil formers can also be cast with a plastic compound and then do not necessarily need to be accommodated in a region with a high class of protection. In this case, the pocket 11 does not necessarily need to be closed in sealtight fashion. Openings 12 in the basic body 10 on the side 7 are used for passing through both DC-side and AC-side connection lines for the connection of the inverter 1 to a photovoltaic generator, on the one hand, and an AC grid, on the other hand, for example. The further housing modules 4 of the inverter 1 can be dispensed with, depending on the provisions for the inverter 1. Additional further housing modules 4 can also be stacked onto the second housing module 3.

Figure 3:
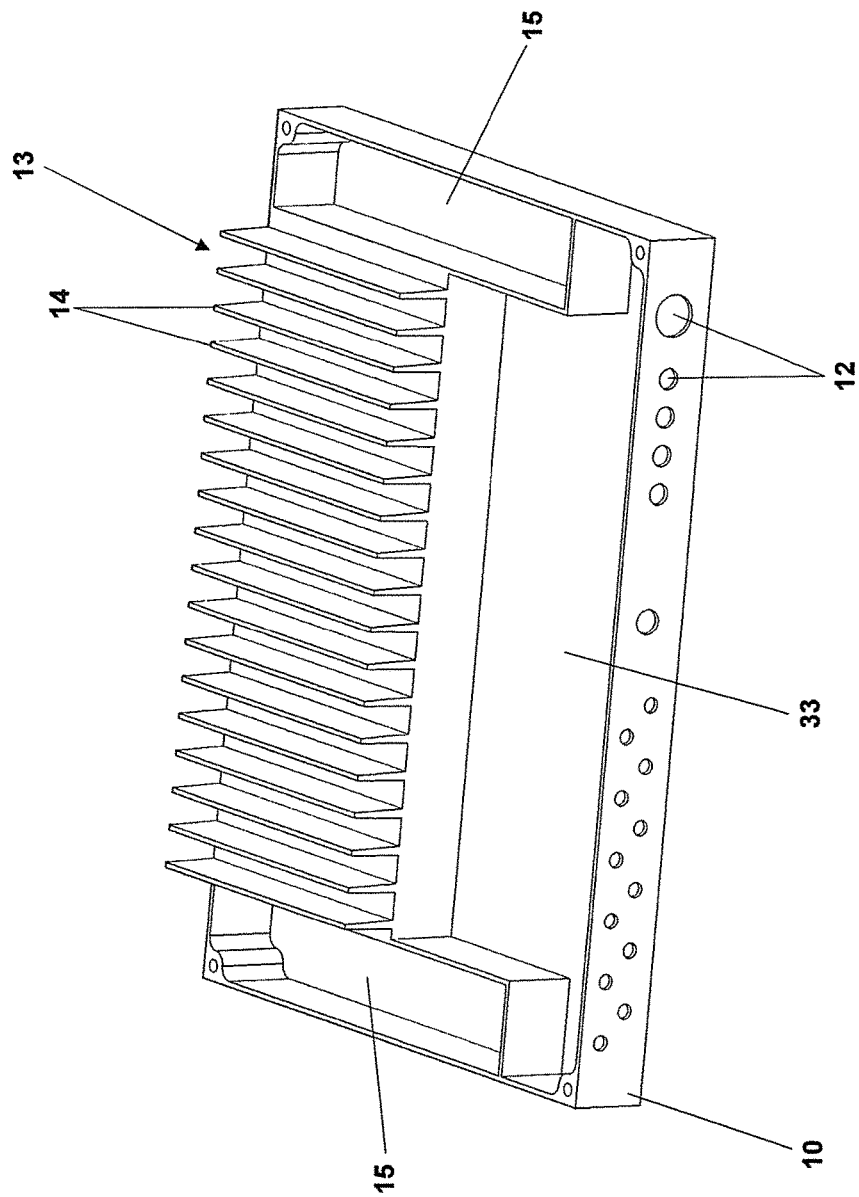
FIG. 3 shows a separate perspective view of a first housing module of the inverter shown in FIGS. 1 and 2 with a viewing direction at angle from the front.
Figure 4:
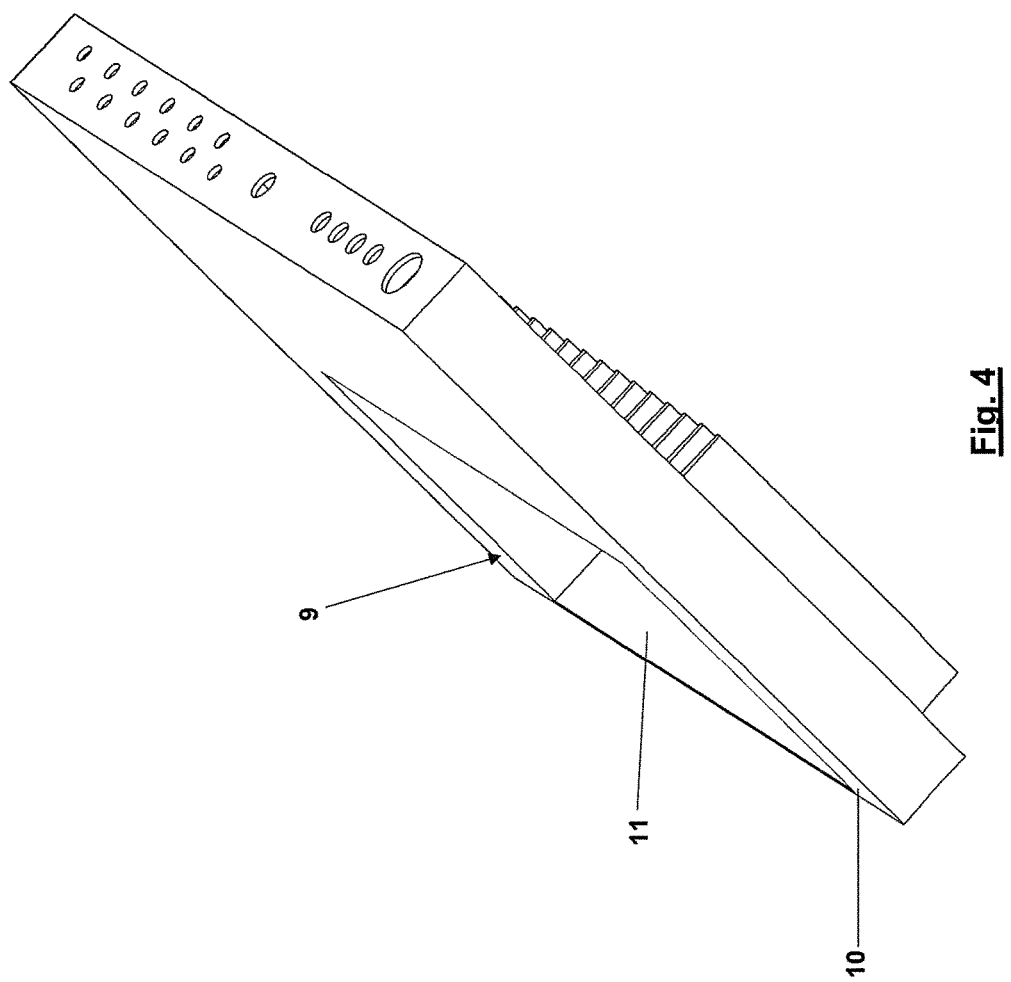
FIG. 4 shows a perspective view of the first housing module shown in FIG. 3 with a viewing direction at an angle from the rear.

The first housing module 2 illustrated separately in FIGS. 3 and 4 has a cooling body 13 with cooling ribs 14 on its front side shown in FIG. 3, the cooling ribs protruding from the region of the basic body 10, which delimits the pocket 11 at the front on the rear side 9 shown in FIG. 4. The coil formers arranged in the pocket 11 are then in direct thermal contact with the air in the cooling air channel 6 shown in FIGS. 1 and 2, in which the cooling body 13 engages, via the cooling body 13. Regions 15, which are sealed with respect to the cooling channel 6 and also the surrounding environment 31 of the inverter 1 in the case of the assembled inverter 1 shown in FIGS. 1 and 2, are positioned next to the cooling body 13.

Figure 5:
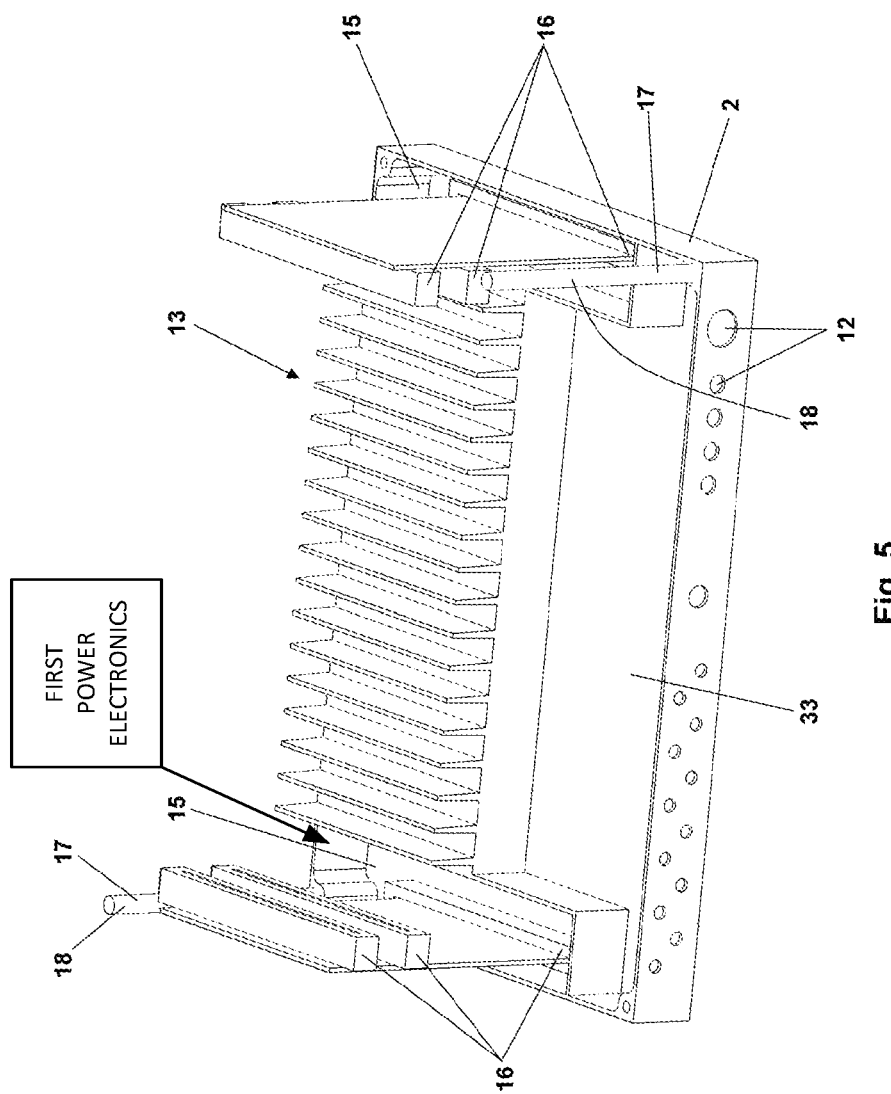
FIG. 5 shows a perspective view corresponding to FIG. 3 of the first housing module together with linear guides for and electrical plug-type connections to other housing modules.

As shown in FIG. 5, plug-type connections 16 for making electrical contact between the power electronics component parts of the inverter 1 which are arranged in the first housing module 2 and power electronics component parts of the inverter 1 which are arranged in the other housing modules 3 and 4 are provided in the regions 15. It is within the scope of the disclosure that openings are provided in the walls of the housing module 2 which delimit the regions 15 (openings not illustrated in the figure). These openings enable electrical connections firstly between the coil formers arranged in the pocket 11 and the plug-type connections 16 and secondly between the components within a region 33 (FIG. 3) which openly adjoins the cooling air channel and is accessible from the outside for the electrical connections through the openings 12 and the plug-type connections 16. If the region 15 and the pocket 11 in the assembled state of the inverter 1 have different classes of protection, the electrical connections need to be performed using cable bushings sealed off in the openings, which cable bushings, in the fitted state, have the respectively higher class of protection. The same applies for the electrical connections between the regions 15 and 33. Furthermore, FIG. 5 shows linear guides 17 in the form of guide rods 18, which protrude in the direction of the stack of the housing modules 2 to 4 from the first, rear housing module 2.

Figure 6:
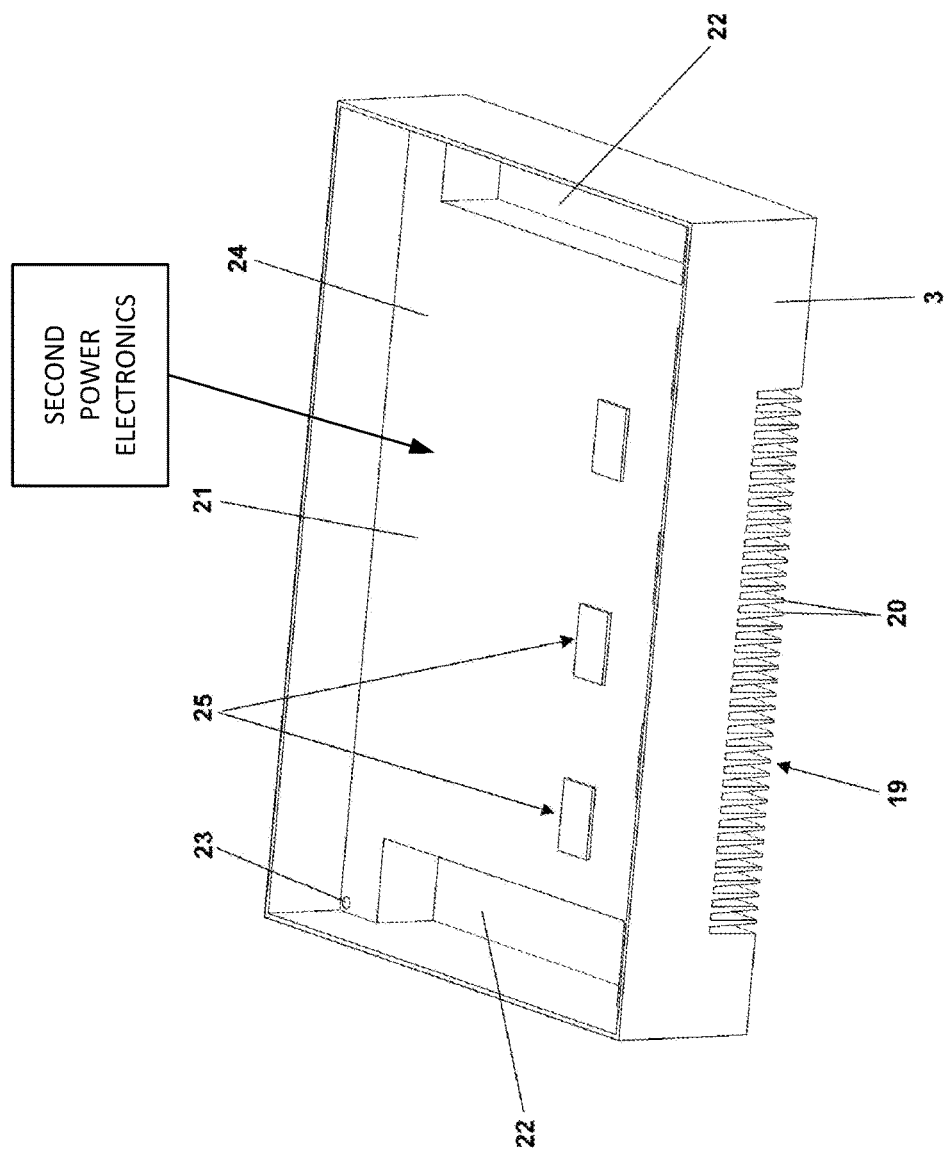
FIG. 6 shows a perspective view of a second housing module with a viewing direction at an angle from the front.
Figure 7:
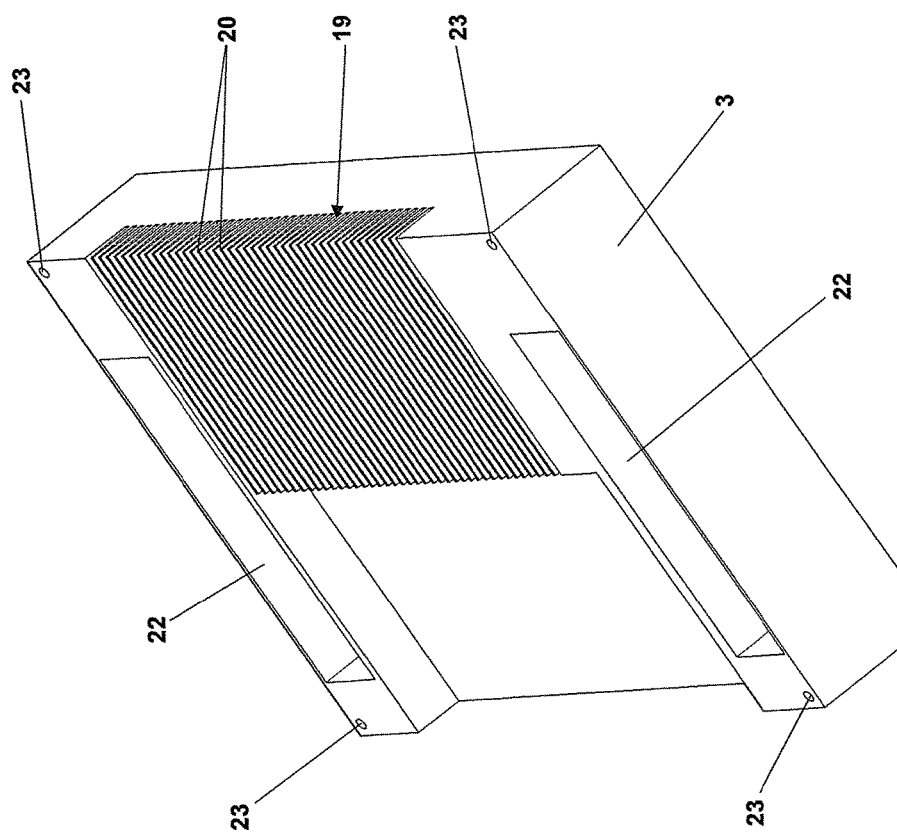
FIG. 7 shows a perspective view of the housing module shown in FIG. 6 with a viewing direction at an angle from the rear.

FIGS. 6 and 7 show the second housing module 3, which has a cooling body 19 comprising cooling ribs 20 for engaging in the cooling air channel 6 shown in FIG. 1 on its rear side and a region 21, which is delimited with respect to the cooling air channel 6, on its front side. The region 21 merges towards the rear with subregions 22, which communicate with the regions 15 of the first housing module 2 when the inverter 1 is assembled. Furthermore, the second housing module 3 comprises holes or guide bushes 23 for guiding the housing module 3 onto the guide rods 18 shown in FIG. 5. A metallic basic body 24 of the second housing module 3 is thickened in the region of receptacles 25 for power electronics component parts to be coupled thermally to the cooling air channel, in the region 21.

Figure 8:
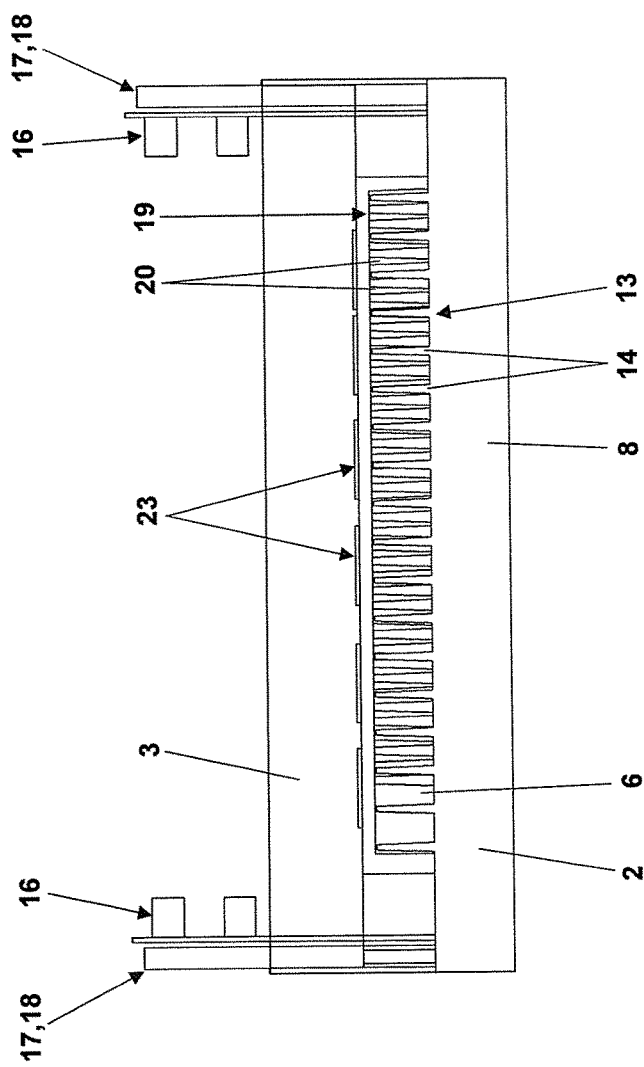
FIG. 8 shows the first housing module and the second housing module in the assembled state together with the linear guides and plug-type connections shown in FIG. 5, wherein the second housing module is illustrated as being transparent so that the linear guides and plug-type connections are also visible in this region.

FIG. 8 shows, with a viewing direction onto the side 8 of the inverter 1, the first housing module 2 and the second housing module 3 adjoined thereto with the guide rods 18 and plug-type connections 16 protruding through the housing module. The view in this case is along the throughflow direction of the cooling air channel 6, into which, in the viewing direction, first the cooling ribs 14 of the cooling body 13 protrude from the first housing module 2 and then the cooling ribs 20 protrude from the cooling body 19 of the second housing module 3.

Figure 9:
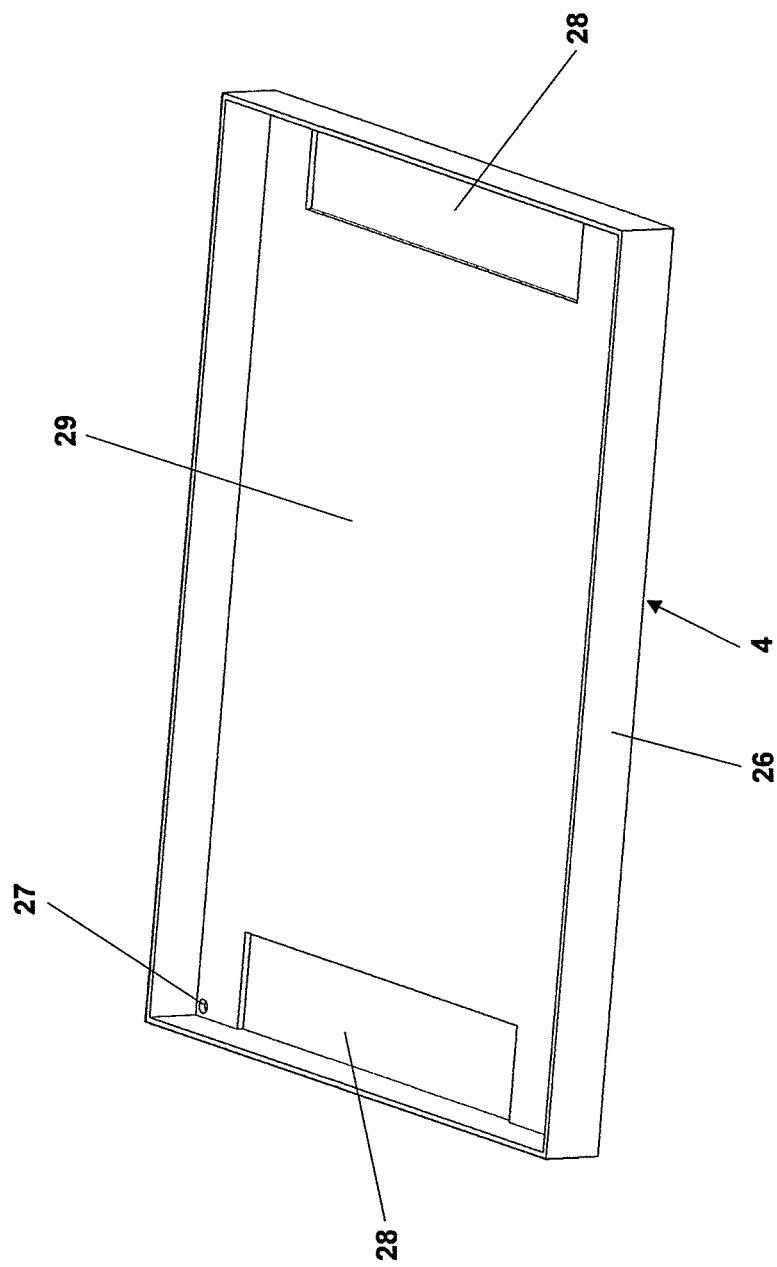
FIG. 9 shows a perspective view of a further housing module of the inverter with a viewing direction at an angle from the front.

The further housing module 4 illustrated in FIG. 9 has a basic body 26, which has holes or guide bushes 27 for the guide rods 18 shown in FIG. 8 and cutouts 28 for the plug-type connections 16 and otherwise surrounds a region 29 on its front side. Component parts of the inverter 1 which do not require any cooling or do not require any particular pronounced cooling because they are not in direct thermal contact with the cooling air channel 6 shown in FIG. 8 can be arranged in this region 29. In this case, the further housing module 4 is to be understood as an optional component part within the inverter 1. Thus, the inverter 1 can have, in the assembled state, no housing module 4, only one or else a plurality of housing modules 4, for example. For example, the number of DC-to-DC converters or of DC-link capacitors of the inverter 1 can be varied in a simple manner with the aid of this modular design.

Figure 10:
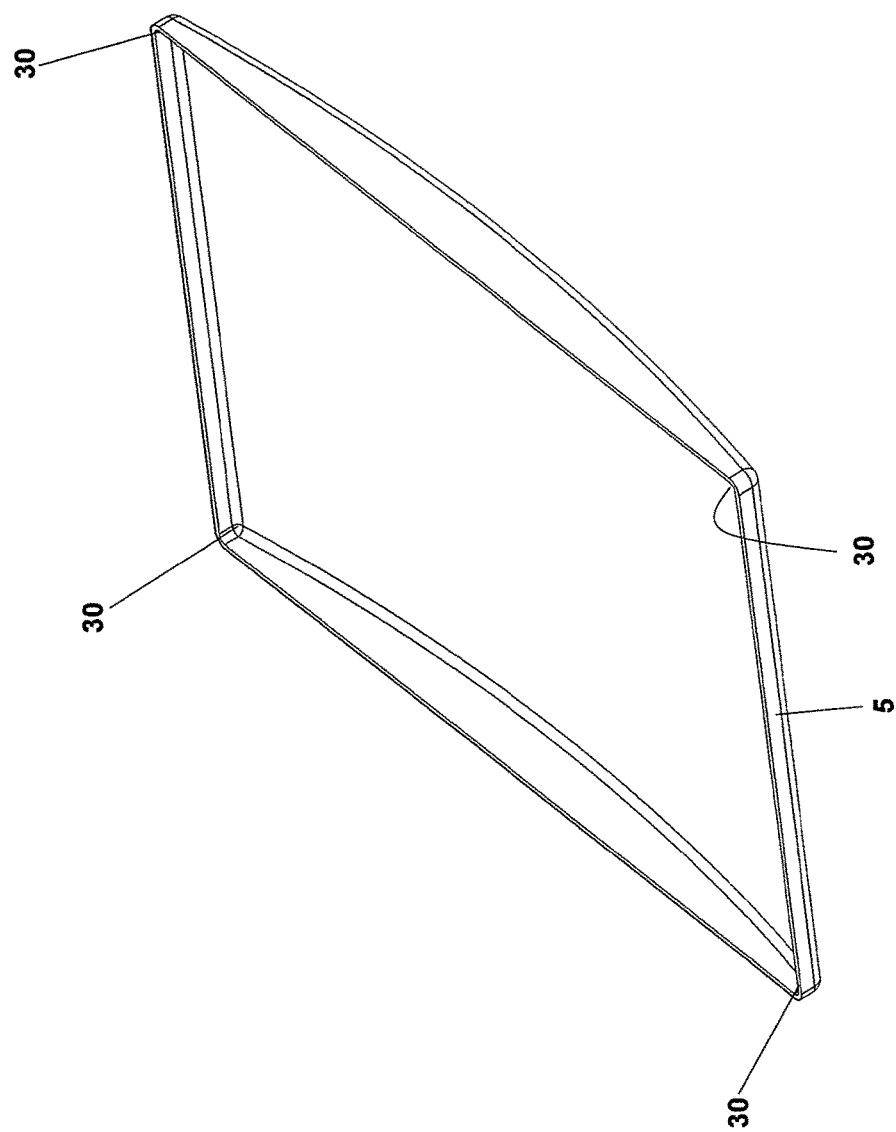
FIG. 10 shows a perspective view of a housing cover of the inverter with a viewing direction at an angle from the rear.

FIG. 10 shows the housing cover 5 of the inverter 1. The housing cover not only fits on the further housing modules 4, as in FIGS. 1 and 2, but also directly on the second housing module 3. In order to enlarge the region in the interior of the inverter which is closed off with respect to the surrounding environment 31 of the inverter 1, the housing cover 5 is curved. The housing cover 5 can have, for example, windows for a display of the inverter or apertures for operating elements. The housing cover 5 is not provided with guide openings for the guide rods 18. However, its corners 30 can be guided on the guide rods 18 in order to ensure defined assembly of the entire inverter 1 including the housing cover 5.

Figure 11:
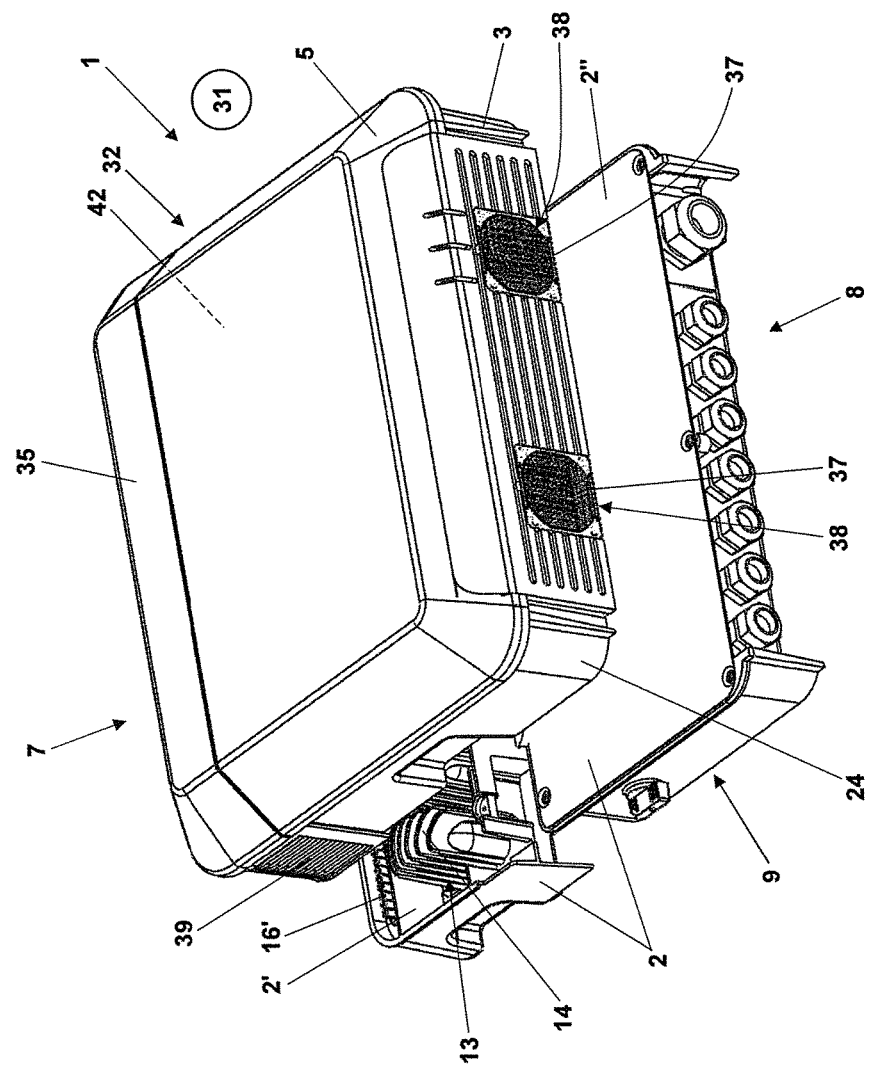
FIG. 11 shows a perspective external view of the first housing module which for its part is in two parts here and has not yet been assembled and of the second housing module which has not yet been connected to the first housing module of a further inverter according to the disclosure with a viewing direction at an angle from below.
Figure 12:
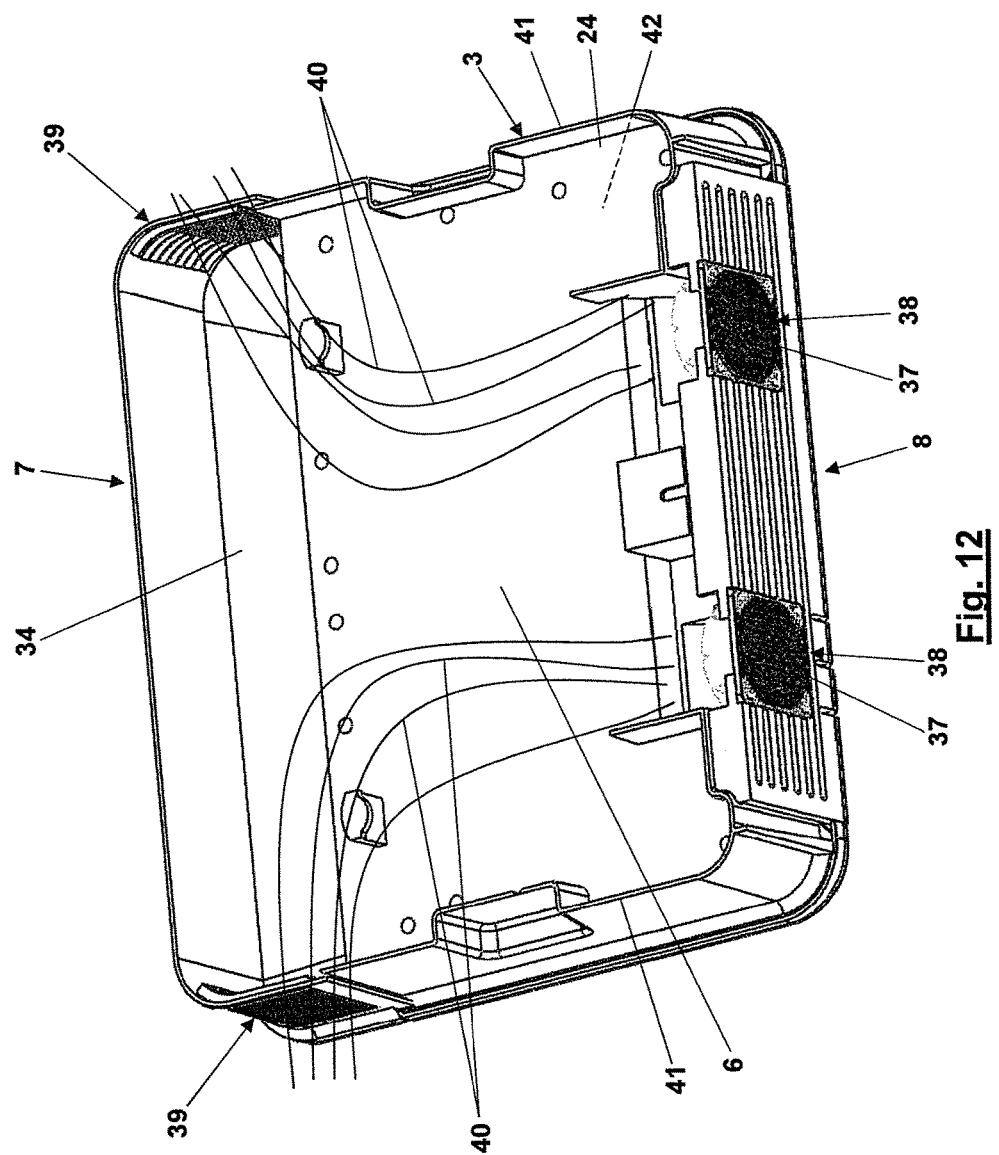
FIG. 12 shows a perspective external view of the second housing module of the inverter shown in FIG. 11 with a viewing direction at an angle from the rear.
Figure 13:
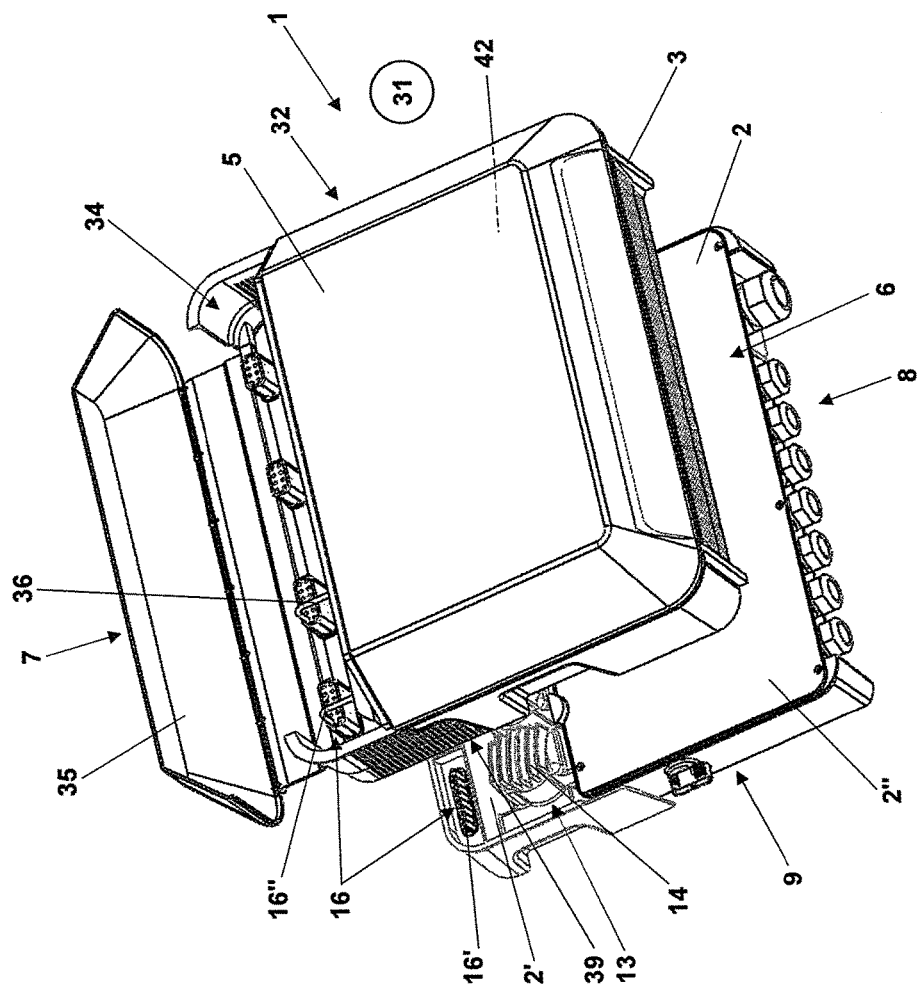
FIG. 13 shows a perspective external view of the assembled first housing module and the second housing module, which is not yet connected to the first housing module, of the inverter shown in FIG. 11 with the connecting region open and with a different viewing direction at an angle from below than in FIG. 11.

FIGS. 11-13 show an inverter 1, which differs from the inverter shown in FIGS. 1 to 10 in terms of the following details. The first housing module 2 for its part is in two parts. It comprises an inductor part 2' receiving coil formers and a connection part 2" receiving electrical connections. The second housing module 3 surrounds a connecting region 34, which is open towards the first housing module and is covered by a foldable protective cover 35. In this case, the plug-type connections 16 are assembled from plug-type connectors 16' mounted fixed in position on the inductor part 2' of the first housing module 2 and plug-type connectors 16" mounted flexibly via cables 36 in the connecting region 34 on the second housing module 3. The plug-type connectors 16', 16" can for their part in the plugged-together state be sealed off to such an extent that the connecting region 34 only needs to be protected from the direct action of deposits by the protective cover. Even if the inverter 1 is fitted outdoors, a high IP class of protection of the connecting region 34 is not absolutely necessary if the plug-type connectors 16', 16" in the plugged-together state seal one another off and cable bushings of the plug-type connectors 16', 16" in the adjoining regions having a high IP class of protection are designed corresponding to the respective IP class of protection. The cooling air channel 6 begins at the bottom on the side 8 with ventilation gratings 37, behind which cooling air fans 38 are arranged, which blow upwards towards the side 7. The case illustrated in FIGS. 11-13 with two cooling air fans 38 in each case behind a separate ventilation grating 37 is merely by way of example. Thus, less than or more than two cooling air fans 38 can also be arranged behind separate ventilation gratings 37 or a continuous ventilation grating extending over the entire width of the cooling air channel 6. At the top on side 7, the housing 1 is closed, however. The cooling air channel 6 instead ends here at lateral ventilation gratings 39. A throughflow, indicated by flow lines 40, of the cooling air channel 6 thus bends toward the side; and the cooling air channel 6 effectively has a T or Y shape. As a result, deposits from the side 7, i.e. from above, are prevented from entering the cooling air channel 6 and thus falling on further component parts in the region of the cooling air channel 6, for example the plug-type connections 16 and/or the cooling air fans 38. The cooling bodies 13 protruding into the cooling air channel 6 have cooling ribs 14 which are curved corresponding to the flow lines 40. The cooling air channel 6 extends over the entire width of the housing 1, i.e. it is laterally delimited only by walls 41 protruding rearwards from the second housing module. In this case, the two housing modules 2, 3 can also have further cooling bodies 13 with cooling ribs 14 protruding into the cooling air channel 6, thus, for example, also in the region of the cooling air channel 6, which has a largely linear flow direction. However, these are not illustrated in FIGS. 11 to 13 for reasons of clarity. A region 42 receiving the power electronics component parts of the second housing module 3 is sealed off between the second housing module 3 and the housing cover 5 even before the second housing module 3 is connected to the first housing module 2. In order to ensure a higher IP class of protection in the region 42 receiving the power electronics component parts relative to the connecting region 34, the cables 36 are sealed off with corresponding seals towards the delimiting walls through which they are passed.

The invention claimed is:

1. An inverter, comprising:
 a housing, comprising:
  a first housing module,
  a second housing module, which is connected detachably to the first housing module, and
  an enclosed cooling air channel, which opens out into a surrounding environment of the inverter, wherein the enclosed cooling air channel is delimited in a circumferential direction partially by the first housing module and partially by the second housing module being structurally coupled together, and
 first and second power electronics component parts in the first housing module and the second housing module, respectively,
 wherein the first housing module has a first surface that is configured to fit on an external structure and defines a fitting plane, and the second housing module is configured to exclusively fit on the first housing module,
 wherein the enclosed cooling air channel is separated and spaced away from the fitting plane of the inverter by a spacing distance, wherein the fitting plane is defined by the first surface of the first housing module with respect to the external structure, and
 wherein the first and second power electronics component parts are separated from the enclosed cooling air channel by walls of the first and second housing modules thus defining first and second portions of the first and second housing modules, respectively, such that the first and second power electronics component parts are arranged in first portions of the first and second housing modules that are not arranged in the enclosed cooling air channel that resides in second portions of the first and second housing modules, respectively, but instead are protected from an environment passing through the enclosed cooling air channel.

2. The inverter as claimed in claim 1, wherein the first housing module and/or the second housing module comprise at least one cooling body, which projects into the enclosed cooling air channel and with which one or more of the power electronics component parts are in thermal contact.

3. The inverter as claimed in claim 1, wherein the first housing module and/or the second housing module, which is connected detachably to the first housing module, seals off or seal off at least one region for one or more of the first and/or second power electronics component parts, respectively, with respect to the surrounding environment of the inverter.

4. The inverter as claimed in claim 1, further comprising at least one seal configured to seal off at least one coherent region with respect to the surrounding environment arranged between the first housing module and the second housing module, wherein the at least one coherent region is partially in the first housing module and partially in the second housing module.

5. The inverter as claimed in claim 4, wherein the at least one coherent region is a coolant channel for a liquid coolant that extends through the first housing module and the second housing module.

6. The inverter as claimed in claim 1, wherein the first housing module and/or the second housing module each have at least one receptacle configured to position one or more of the first and/or second power electronics component parts, respectively.

7. The inverter as claimed in claim 1, further comprising electrical plug-type connections configured to make alternate contact with first and/or second power electronics component parts in the first and/or second housing modules, respectively, wherein the electrical plug-type connections are provided between the first housing module and the second housing module.

8. The inverter as claimed in claim 1, further comprising mechanical linear guides configured to provide alternate orientation when the housing modules are assembled linearly, wherein the mechanical linear guides are provided between the first housing module and the second housing module.

9. The inverter as claimed in claim 1, further comprising DC connections and/or DC switch disconnectors and/or AC connections and/or AC switch disconnectors and/or winding materials arranged in the first housing module.

10. The inverter as claimed in claim 1, further comprising circuit boards of power electronics and/or switches of an inverter bridge and/or circuit boards of control electronics arranged in the second housing module.

11. The inverter as claimed in claim 1, wherein the first housing module and/or the second housing module has a basic body comprising metal, wherein the basic body comprises a part of the first and/or second housing module, respectively, that delimits the enclosed cooling air channel.

12. The inverter as claimed in claim 11, further comprising at least two further housing modules with identical basic bodies stacked onto the second housing module.

13. The inverter as claimed in claim 11, wherein the stack of housing modules is closed off by a housing cover.

14. The inverter as claimed in claim 1, further comprising at least one further housing module that adjoins the second housing module on a side thereof opposite the first housing module.

15. The inverter as claimed in claim 1, wherein the enclosed cooling air channel, at one of at least two ends which open out into the surrounding environment of the inverter, is provided with at least one cooling air fan.

16. The inverter as claimed in claim 15, wherein the enclosed cooling air channel branches upwards in the form of a Y or T, wherein the cooling air fan is provided at its lower end, and its two upper ends lie laterally on the housing.

17. The inverter as claimed in claim 15, further comprising electrical connections between the first housing module and/or the second housing module arranged in a covered connecting region above the enclosed cooling air channel.

18. The inverter as claimed in claim 1, wherein the enclosed cooling air channel extends in terms of its width over more than two thirds of the width of the housing.

19. The inverter as claimed in claim 1, wherein the enclosed cooling air channel comprises a plurality of ribs extending along a length thereof protruding from one of the first and second housing modules.

* * * * *